(12) United States Patent
Baselmans et al.

(10) Patent No.: US 7,342,644 B2
(45) Date of Patent: Mar. 11, 2008

(54) METHODS AND SYSTEMS FOR LITHOGRAPHIC BEAM GENERATION

(75) Inventors: Johannes Jacobus Matheus Baselmans, Oirschot (NL); Anastasius Jacobus Anicetus Bruinsma, Delft (NL); Pieter Willem Herman De Jager, Rotterdam (NL); Robert-Han Munnig Schmidt, Hapert (NL); Henri Johannes Petrus Vink, Delft (NL)

(73) Assignee: ASML Netherlands B.V., Veldhoven (NL)

( * ) Notice: Subject to any disclaimer, the term of this patent is extended or adjusted under 35 U.S.C. 154(b) by 228 days.

(21) Appl. No.: 11/023,628

(22) Filed: Dec. 29, 2004

(65) Prior Publication Data

US 2006/0139609 A1 Jun. 29, 2006

(51) Int. Cl.
*G03B 27/72* (2006.01)
*G03B 27/54* (2006.01)

(52) U.S. Cl. .......................... 355/69; 355/67
(58) Field of Classification Search ................. 355/53, 355/67–71; 430/311; 359/291–292
See application file for complete search history.

(56) References Cited

U.S. PATENT DOCUMENTS

| | | | |
|---|---|---|---|
| 5,229,872 A * | 7/1993 | Mumola | 349/2 |
| 5,296,891 A | 3/1994 | Vogt et al. | |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,677,703 A | 10/1997 | Bhuva et al. | |
| 5,808,797 A | 9/1998 | Bloom et al. | |
| 5,982,553 A | 11/1999 | Bloom et al. | |
| 6,133,986 A | 10/2000 | Johnson | |
| 6,177,980 B1 | 1/2001 | Johnson | |
| 6,687,041 B1 | 2/2004 | Sandstrom | |
| 6,747,783 B1 | 6/2004 | Sandstrom | |
| 6,795,169 B2 | 9/2004 | Tanaka et al. | |
| 6,806,897 B2 | 10/2004 | Kataoka et al. | |
| 6,811,953 B2 | 11/2004 | Hatada et al. | |
| 7,061,586 B2 * | 6/2006 | Sytsma et al. | 355/69 |
| 2004/0041104 A1 | 3/2004 | Liebregts et al. | |
| 2004/0130561 A1 | 7/2004 | Jain | |
| 2005/0007572 A1 | 1/2005 | George et al. | |

FOREIGN PATENT DOCUMENTS

| | | |
|---|---|---|
| WO | WO 98/33096 | 7/1998 |
| WO | WO 98/38597 | 9/1998 |

* cited by examiner

*Primary Examiner*—Henry Hung Nguyen
(74) *Attorney, Agent, or Firm*—Sterne, Kessler, Goldstein & Fox P.L.L.C.

(57) ABSTRACT

A lithographic illumination apparatus and method includes receiving a plurality of source radiation beams from a plurality of corresponding radiation sources, deflecting the plurality of source radiation beams along a common beam path, thereby generating a projection beam of radiation, imparting the projection beam of radiation with a cross-section pattern, and projecting the patterned projection beam of radiation onto a target portion of a substrate.

19 Claims, 7 Drawing Sheets

METHODS AND SYSTEMS FOR LITHOGRAPHIC BEAM GENERATION

BACKGROUND OF THE INVENTION

1. Field of the Invention

The present invention relates to lithographic illumination systems and methods and, more particularly, to multiple radiation source beams projected onto a common beam path.

2. Related Art

A lithographic apparatus is a machine that applies a desired pattern onto a target portion of a substrate. Lithographic apparatus can be used, for example, in the manufacture of integrated circuits (ICs), flat panel displays and other devices involving fine structures. In a conventional lithographic apparatus, a patterning means, which is alternatively referred to as a mask or a reticle, may be used to generate a circuit pattern corresponding to an individual layer of the IC (or other device), and this pattern can be imaged onto a target portion (e.g., comprising part of, one or several dies) on a substrate (e.g., a silicon wafer or glass plate) that has a layer of radiation-sensitive material (e.g., a resist). Instead of a mask, the patterning means may comprise a contrast device, such as an array of individually controllable elements that serve to generate the circuit pattern.

In general, a single substrate will contain a network of adjacent target portions to be exposed. Known lithographic apparatus include so-called steppers, in which each target portion is irradiated an entire pattern onto the target portion in a single exposure, and so-called scanners, in which each target portion is irradiated by scanning the pattern through the projection beam in a given direction (the "scanning"-direction) while synchronously scanning the substrate parallel or anti-parallel to this direction.

Lithographic apparatus are known in which a pattern is imparted to a projection beam by an array of individually controllable elements. Thus, in such apparatus, rather than relying upon a preformed mask (also referred to as a reticle) to impart a pattern to a beam, control signals are delivered to the array of controllable elements so as to control the state of those elements thereby to pattern a projection beam. Such apparatus is generally referred to as "maskless" given that it relies upon individually controllable elements rather than a mask to impart the necessary pattern to the projection beam.

Maskless lithographic apparatus can be used to expose relatively large area substrates, for example substrate to be used as flat panel displays. Such panels may be exposed in a single pass beneath an array of projection systems, each of which is provided with its own patterning system incorporating an array of individually controllable elements. As the substrate is displaced relative to the projection systems, it is necessary to change the state of individual elements in the arrays of controllable elements so as to change the projected patterns. The rate at which the state of the individual elements can be changed (generally referred to as the update rate) is limited, and this imposes an upper limit on the maximum speed at which a substrate can be displaced relative to the projection systems. The speed of displacement determines the maximum throughput of the apparatus.

The speed of displacement is also dependent upon the intensity of the projection beam used to irradiate the substrate. For a given intensity projection beam, the larger the area of substrate exposed by the beam, then the smaller the power/intensity density of the radiation beam per unit area of substrate.

In order to transfer the desired pattern to the substrate, it is necessary to provide a predetermined total amount of radiation energy per unit area of substrate formed. This predetermined total amount will vary, depending upon the wavelength or type of radiation beam, and the type and thickness of the resist material. If the power per unit area of substrate if decreased, then a longer exposure time is required. Thus, the projection beam power also determines the maximum throughput of the apparatus.

However, it is not always possible to provide a single radiation source having the desired power output. The power output of radiation sources can be limited by technology and/or the cost of high power radiation sources can be relatively expensive.

There is a need, therefore, for improved lithography illumination systems and methods.

SUMMARY OF THE INVENTION

The present invention is directed to lithographic illumination systems and methods and, more particularly, to multiple radiation source beams projected onto a common beam path.

According to an embodiment of the invention, there is provided a lithographic illumination system, including: at least one radiation input configured to receive a plurality of source radiation beams from respective radiation sources; at least one radiation beam deflecting element optically coupled to the at least one radiation input; and a common beam output optically coupled to said at least one radiation beam deflecting element along a common beam path; wherein the at least one radiation beam deflecting element is configured to deflect each of a plurality of the source radiation beams along the common beam path.

By providing such a beam delivery system, the radiation beams from a plurality of radiation sources are combined to perform the projection beam. Thus, a single, relatively high-power projection beam of radiation can be formed using radiation beams from several lower power radiation sources. Optionally, each of the source radiation beams is a pulsed radiation beam including a periodic series of radiation pulses, and the projection beam includes a series of discrete radiation pulses, each radiation pulse in the projection beam being formed of a respective single pulse from a respective single source radiation beam.

By ensuring that the pulses from the individual source radiation beams do not overlap in the projection beam, interference effects between the different source radiation beams are avoided.

Typically, each of the source radiation beams is of substantially the same wavelength of radiation, and each of the periodic series of radiation pulses has substantially the same repetition frequency.

In an embodiment, the projection beam includes a periodic series of groups of radiation pulses, and each group of pulses is separated by a time period sufficient to allow a change in configuration of at least one of said controllable elements.

Such a projection beam is particularly suitable for operation of the lithographic apparatus in "pulse mode". The pattern of the array of individually controllable elements can thus be updated as required between the groups of pulses of the projection beam.

In an embodiment, the beam delivery system further includes a group intensity controller arranged to control the intensity of at least one pulse within each group, for ensuring the radiation intensity of each group is within predetermined limits.

Power outputs from each individual radiation source can vary over time. As several source radiation beams are combined to provide the projection beam, then this variation in source output intensity is, to some degree, averaged out. However, some variation in the total power output of each group of pulses is likely, and thus it is desirable to provide an intensity controller to control the intensity/power of the group, by varying the intensity/power of at least one of the pulses within the group.

The group intensity controller is optionally arranged to selectively inhibit the provision of the at least one pulse to the group of pulses. Alternatively, or additionally, the group intensity controller is arranged to controllably attenuate the intensity of at least one pulse.

The at least one pulse is the last pulse in each group, and the group intensity controller can be arranged to control the intensity in dependence upon the measured intensity of the other pulses within the group. This provides a readily achievable way of altering the total group intensity.

Alternatively, the at least one pulse is the last pulse in each group, and the group intensity controller can be arranged to control the intensity in dependence upon the measured intensity of each of the pulses within said group.

The at least one radiation beam deflecting element optionally includes a controllable radiation beam deflecting element, each of the received source radiation beams being incident upon the controllable radiation beam deflecting element, which acts to deflect each received source radiation beam along the single common beam path. Such a controllable radiation beam deflecting element can include a photoacoustic modulator or mirror. The deflection of the controllable radiation beam deflecting beam element can be altered (e.g., adapted or updated) in the time between the pulses between successive source radiation beams, such that pulses from source radiation beams are in turn directed along the common beam path.

Alternatively, each of the source radiation beams are polarized, the at least one radiation beam deflecting element includes at least one polarized beam splitter, and the beam delivery system further includes a controllable polarization changing element arranged to change the polarization state of incident radiation.

The apparatus optionally includes the respective radiation sources for providing the plurality of source radiation beams.

According to a further embodiment of the invention, there is provided a method including: receiving a plurality of source radiation beams from a plurality of corresponding radiation sources; deflecting the plurality of source radiation beams along a common beam path, thereby generating a projection beam of radiation; imparting the projection beam of radiation with a cross-section pattern; and projecting the patterned projection beam of radiation onto a target portion of a substrate.

Each of the source radiation beams optionally includes a pulsed radiation beam including a periodic series of radiation pulses, and the projection beam comprises a series of discrete radiation pulses, each radiation pulse in the projection beam being formed of a respective single pulse from a respective source radiation beam.

The source radiation beams can be of substantially the same wavelength of radiation, and have substantially the same repetition frequency.

The projection beam optionally includes a periodic series of groups of radiation pulses, and wherein each group of pulses is separated by a time period sufficient to allow a change in configuration of at least one of said controllable elements.

Each group of pulses optionally includes one pulse from each source radiation beam.

The intensity of at least one pulse within each group is optionally controlled, so as to ensure the total radiation intensity of each group is within predetermined limits.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

Embodiments of the invention will now be described, by way of example only, with reference to the accompanying drawing figures in which corresponding reference symbols indicate corresponding parts.

DETAILED DESCRIPTION OF THE PRESENT INVENTION

I. Introduction

Figure 1:
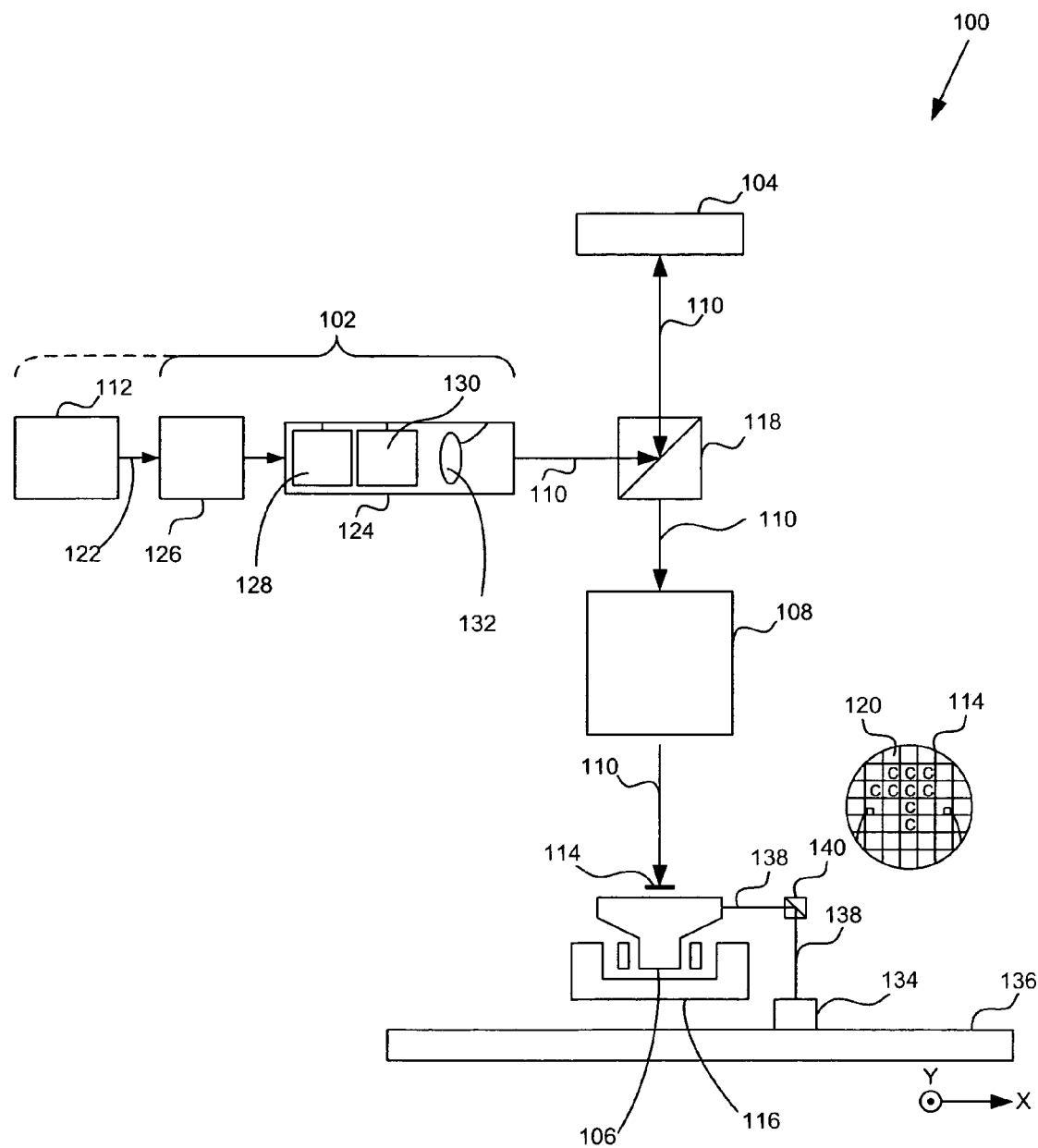
FIG. 1 is a block diagram of a lithographic apparatus.

The present invention is directed to multiple radiation source beams projected onto a common beam path.

Although specific reference can be made in this text to the use of lithographic apparatus in the manufacture of integrated circuits (ICs), it should be understood that the lithographic apparatus described herein can have other applications, such as the manufacture of integrated optical systems, guidance and detection patterns for magnetic domain memories, flat panel displays, thin-film magnetic heads, micro and macro fluidic devices, etc. The skilled artisan will appreciate that, in the context of such alternative applications, any use of the terms "wafer" or "die" herein can be considered as synonymous with the more general terms "substrate" or "target portion," respectively. The substrate referred to herein can be processed, before or after exposure, in for example a track (e.g., a tool that typically applies a layer of resist to a substrate and develops the exposed resist) or a metrology or inspection tool. Where applicable, the disclosure herein can be applied to such and other substrate processing tools. Further, the substrate can be processed more than once, for example, in order to create a multi-layer IC, so that the term substrate used herein can also refer to a substrate that already contains multiple processed layers.

A. Terminology

The term "array of individually controllable elements" as here employed should be broadly interpreted as referring to any means that can be used to endow an incoming radiation beam with a patterned cross-section, so that a desired pattern can be created in a target portion of the substrate. The terms "light valve" and "Spatial Light Modulator" (SLM) can also be used in this context. Examples of such patterning are discussed below.

A programmable mirror array. This may comprise a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate spatial filter, the said undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter may filter out the diffracted light, leaving the undiffracted light to reach the substrate. An array of diffractive optical MEMS devices can also be used in a corresponding manner. Each diffractive optical MEMS device can include a plurality of reflective ribbons that can be deformed relative to one another to form a grating that reflects incident light as diffracted light.

A further alternative embodiment of a programmable mirror array can include a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronic means.

In both of the situations described above, the array of individually controllable elements can comprise one or more programmable mirror arrays. Mirror arrays are described in, for example, from United States Patents U.S. Pat. No. 5,296,891 and U.S. Pat. No. 5,523,193, and PCT patent applications WO 98/38597 and WO 98/33096, which are incorporated herein by reference in their entireties.

A programmable LCD array can also be used. An example of such a construction is given in United States Patent U.S. Pat. No. 5,229,872, which is incorporated herein by reference in its entirety.

It should be appreciated that where pre-biasing of features, optical proximity correction features, phase variation techniques and/or multiple exposure techniques are implemented, the resultant pattern "displayed" on the array of individually controllable elements may differ substantially from the pattern eventually transferred to a layer of or on the substrate. Similarly, the pattern eventually generated on the substrate may not correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

Although specific reference may be made in this text to the use of lithographic apparatus in the manufacture of ICs, it should be understood that the lithographic apparatus described herein may have other applications, such as, for example and not limitation, manufacture of DNA chips, MEMS, MOEMS, integrated optical systems, guidance and detection patterns for magnetic domain memories, flat panel displays, thin-film magnetic heads, etc. One skilled in the relevant art(s) will understand that, in the context of such alternative applications, the use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g., having a wavelength of 365, 355, 248, 193, 157 or 126 nm) and extreme ultra-violet (EUV) radiation (e.g., having a wavelength in the range of 5-20 nm), as well as particle beams, such as ion beams or electron beams.

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system can also encompass various types of optical components, including refractive, reflective, and catadioptric optical components for directing, shaping, or controlling the projection beam of radiation, and such components may also be referred to below, collectively or singularly, as a "lens".

The lithographic apparatus can be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g., water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

Further, the apparatus can be provided with a fluid processing cell to allow interactions between a fluid and irradiated parts of the substrate (e.g., to selectively attach chemicals to the substrate or to selectively modify the surface structure of the substrate).

B. Example Lithography System

FIG. 1 is a block diagram of an example a lithographic projection apparatus 100. Apparatus 100 includes a radiation system 102, an array of individually controllable elements 104, an object table 106 (e.g., a substrate table), and a projection system ("lens") 108.

Radiation system 102 can be used for supplying a beam 110 of radiation (e.g., UV radiation), which in this particular case also comprises a radiation source 112.

An array of individually controllable elements 104 (e.g., a programmable mirror array) can be used for applying a pattern to beam 110. In general, the position of the array of individually controllable elements 104 can be fixed relative to projection system 108. However, in an alternative arrangement, an array of individually controllable elements 104 can be connected to a positioning device (not shown) for accurately positioning it with respect to projection system 108. As here depicted, individually controllable elements 104 are of a reflective type (e.g., have a reflective array of individually controllable elements).

Object table 106 can be provided with a substrate holder (not specifically shown) for holding a substrate 114 (e.g., a resist coated silicon wafer or glass substrate) and object table 106 can be connected to a positioning device 116 for accurately positioning substrate 114 with respect to projection system 108.

Projection system 108 (e.g., a quartz and/or $CaF_2$ lens system or a catadioptric system comprising lens elements made from such materials, or a mirror system) can be used for projecting the patterned beam received from a beam splitter 118 onto a target portion 120 (e.g., one or more dies) of substrate 114. Projection system 108 can project an image of the array of individually controllable elements 104 onto substrate 114. Alternatively, projection system 108 can project images of secondary sources for which the elements of the array of individually controllable elements 104 act as shutters. Projection system 108 can also comprise a micro lens array (MLA) to form the secondary sources and to project microspots onto substrate 114, as is discussed in more detail below.

Source 112 (e.g., a frequency tripled Nd:YAG laser) can produce a beam of radiation 122. Beam 122 is fed into an illumination system (illuminator) 124, either directly or after having traversed conditioning device 126, such as a beam expander, for example. Illuminator 124 can comprise an adjusting device 128 for setting a zoom to adjust a spot size of beam 122. In addition, illuminator 124 will generally include various other components, such as spot generator 130 and a condenser 132. For example, spot generator 130 can be, but is not limited to, a refractive or diffractive grating, segmented mirrors arrays, waveguides, or the like. In this way, beam 110 impinging on the array of individually controllable elements 104 has a desired zoom, spot size, uniformity, and intensity distribution in its cross section.

It should be noted, with regard to FIG. 1, that source 112 can be within the housing of lithographic projection apparatus 100. In alternative embodiments, source 112 can also be remote from lithographic projection apparatus 100. In this case, radiation beam 122 would be directed into apparatus 100 (e.g., with the aid of suitable directing mirrors). It is to be appreciated that both of these scenarios are contemplated within the scope of the present invention.

Beam 110 subsequently intercepts the array of individually controllable elements 104 after being directed using beam splitter 118. Having been reflected by the array of individually controllable elements 104, beam 110 passes through projection system 108, which focuses beam 110 onto a target portion 120 of the substrate 114.

With the aid of positioning device 116 (and optionally interferometric measuring device 134 on a base plate 136 that receives interferometric beams 138 via beam splitter 140), substrate table 6 can be moved accurately, so as to position different target portions 120 in the path of beam 110. Where used, the positioning device for the array of individually controllable elements 104 can be used to accurately correct the position of the array of individually controllable elements 104 with respect to the path of beam 110, e.g., during a scan. In general, movement of object table 106 is realized with the aid of a long-stroke module (course positioning) and a short-stroke module (fine positioning), which are not explicitly depicted in FIG. 1. A similar system can also be used to position the array of individually controllable elements 104. It will be appreciated that beam 110 can alternatively/additionally be moveable, while object table 106 and/or the array of individually controllable elements 104 can have a fixed position to provide the required relative movement.

In an alternative configuration of the embodiment, substrate table 106 can be fixed, with substrate 114 being moveable over substrate table 106. Where this is done, substrate table 106 is provided with a multitude of openings on a flat uppermost surface, gas being fed through the openings to provide a gas cushion which is capable of supporting substrate 114. This is conventionally referred to as an air bearing arrangement. Substrate 114 is moved over substrate table 106 using one or more actuators (not shown), which are capable of accurately positioning substrate 114 with respect to the path of beam 110. Alternatively, substrate 114 can be moved over substrate table 106 by selectively starting and stopping the passage of gas through the openings.

Although lithography apparatus 100 according to the invention is herein described as being for exposing a resist on a substrate, it will be appreciated that the invention is not limited to this use and apparatus 100 can be used to project a patterned beam 110 for use in resistless lithography.

The depicted apparatus 100 can be used in at least the following modes:

1. Step mode: the entire pattern on the array of individually controllable elements 104 is projected in one go (i.e., a single "flash") onto a target portion 120. Substrate table 106 is then moved in the x and/or y directions to a different position for a different target portion 120 to be irradiated by patterned beam 110.

2. Scan mode: essentially the same as step mode, except that a given target portion 120 is not exposed in a single "flash." Instead, the array of individually controllable elements 104 is movable in a given direction (the so-called "scan direction", e.g., the y direction) with a speed v, so that patterned beam 110 is caused to scan over the array of individually controllable elements 104. Concurrently, substrate table 106 is simultaneously moved in the same or opposite direction at a speed V=Mv, in which M is the magnification of projection system 108. In this manner, a relatively large target portion 120 can be exposed, without having to compromise on resolution.

3. Pulse mode: the array of individually controllable elements 104 is kept essentially stationary and the entire pattern is projected onto a target portion 120 of substrate 114 using pulsed radiation system 102. Substrate table 106 is moved with an essentially constant speed such that patterned beam 110 is caused to scan a line across substrate 106. The pattern on the array of individually controllable elements 104 is updated as required between pulses of radiation system 102 and the pulses are timed such that successive target portions 120 are exposed at the required locations on substrate 114. Consequently, patterned beam 110 can scan across substrate 114 to expose the complete pattern for a strip of substrate 114. The process is repeated until complete substrate 114 has been exposed line by line.

4. Continuous scan mode: essentially the same as pulse mode except that a substantially constant radiation system 102 is used and the pattern on the array of individually controllable elements 104 is updated as patterned beam 110 scans across substrate 114 and exposes it.

5. Pixel Grid Imaging Mode: the pattern formed on substrate 114 is realized by subsequent exposure of spots formed by spot generator 130 that are directed onto array 104. The exposed spots have substantially a same shape. One substrate 114 the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use can also be employed.

As here depicted, the apparatus 100 is of a reflective type (i.e., has a reflective array of individually controllable elements). However, in general, it may also be of a transmissive type, for example (i.e., with a transmissive array of individually controllable elements).

II. Multiple Radiation Source Beams

The present invention relates to a beam delivery system, as well as a lithographic apparatus including such a beam delivery system, and an associated method. In the method, the projection beam of radiation is formed by deflecting a plurality of source radiation beams along a single common beam path, to provide the projection beam of radiation.

Typically, the source radiation beams are lasers. The laser outputs are combined by using either a diffractive optical element or a reflective optical element. Although the invention can be implemented with an integrating optical element such as an integrating sphere, additional advantages are obtained when using non-integrating optical elements. For example, an integrating sphere is a hollow sphere having a highly reflecting inside surface, used as a device to collect light scattered or emitted from a light source. Due to the multiple reflections occurring within the integrating optical element, the etendue of the light incident upon the sphere will be increased. This is, at times, undesirable.

By using a radiation beam-deflecting element that is a non-integrating optical element to combine the various source radiation beams, there is reduced impact upon (i.e., increase of) the etendue of the beams. Consequently, the resolution of the apparatus (i.e., the resolution of the projected patterned beam on the substrate) is improved.

Figure 2:
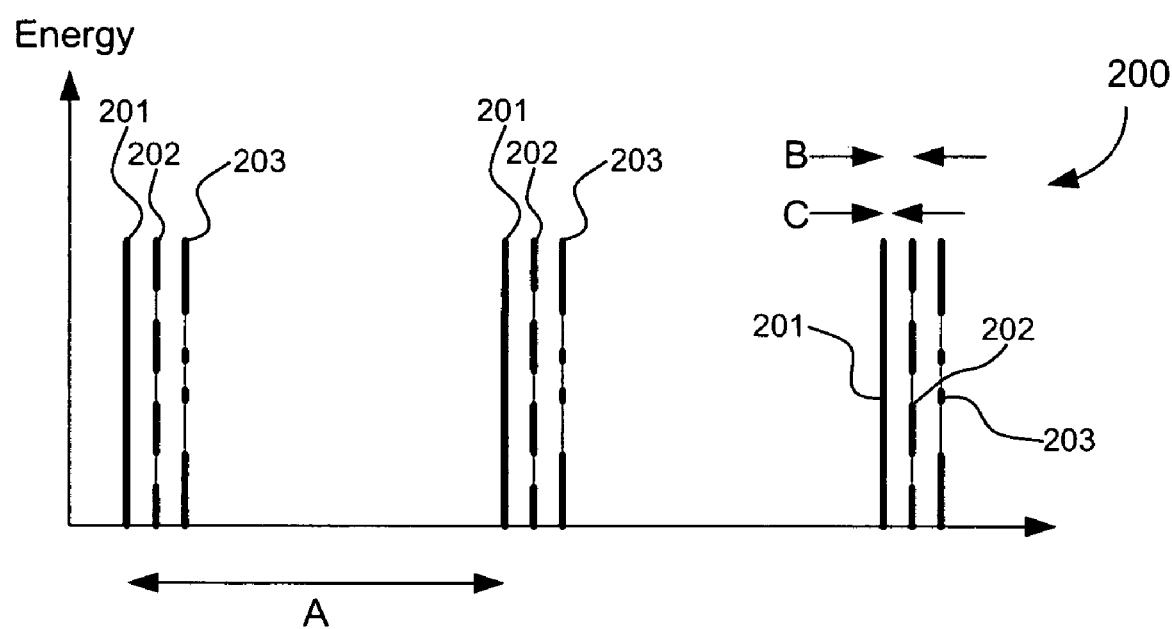
FIG. 2 is a timing diagram of a multi-source projection beam.

FIG. 2 is a timing diagram of an example multi-source projection beam 200 formed from beams from a plurality of radiation sources. In this embodiment, each of the source radiation beams includes a periodic series of radiation pulses. Optionally, each of the source radiation beams has the same repetition frequency.

In the example of FIG. 2, the period of repetition is A seconds. In an embodiment, the repetition rate is approximately 50 kHz, for a repetition period A of 20 μs.

In the example of FIG. 2, the projection beam of radiation 200 includes pulses 201 from a first radiation source, pulses 202 from a second radiation source, and pulses 203 from a third radiation source.

In the example of FIG. 2, the projection beam 200 includes a periodic series of groups of radiation pulses, with one pulse from each radiation source being within each group. The time period B between successive pulses in a group is typically between 30 ns and 500 ns.

In the example of FIG. 2, the pulses within each group do not overlap in time, such that there are substantially no interference effects between the different source radiation beams. In the example of FIG. 2, each pulse has substantially the same pulse width C, which may vary between 20 ns and 500 ns, for example. Within this embodiment, it is envisaged that each of the pulses is of substantially the same amplitude, pulse shape, width and wavelength, so that each pulse is of substantially the same energy. However, it will be appreciated that any one or more of these factors may vary in other embodiments.

Preferably, the time period between each group of pulses is long enough to allow a change in configuration of at least one of the controllable elements within the array of individually controllable elements used to impart the projection beam with a pattern. Thus, to the lithographic apparatus, the projection beam formed of such groups of pulses effectively functions as a single (relatively high power) pulsed radiation source. Typically, the spacing between the individual pulses within each group of pulses is relatively small, such that there is a relatively small time difference between the arrival at the substrate of radiation pulses from the different radiation sources, compared with the time frame of the substrate. Given that the substrate is thus moving relatively slowly, all of the pulses within a group of pulses will thus hit substantially the same area of the substrate. In an embodiment, each group of pulses is less than or equal to approximately 2 μs. In another embodiment, each group of pulses is less than or equal to approximately 1.4 μs.

Figure 3:
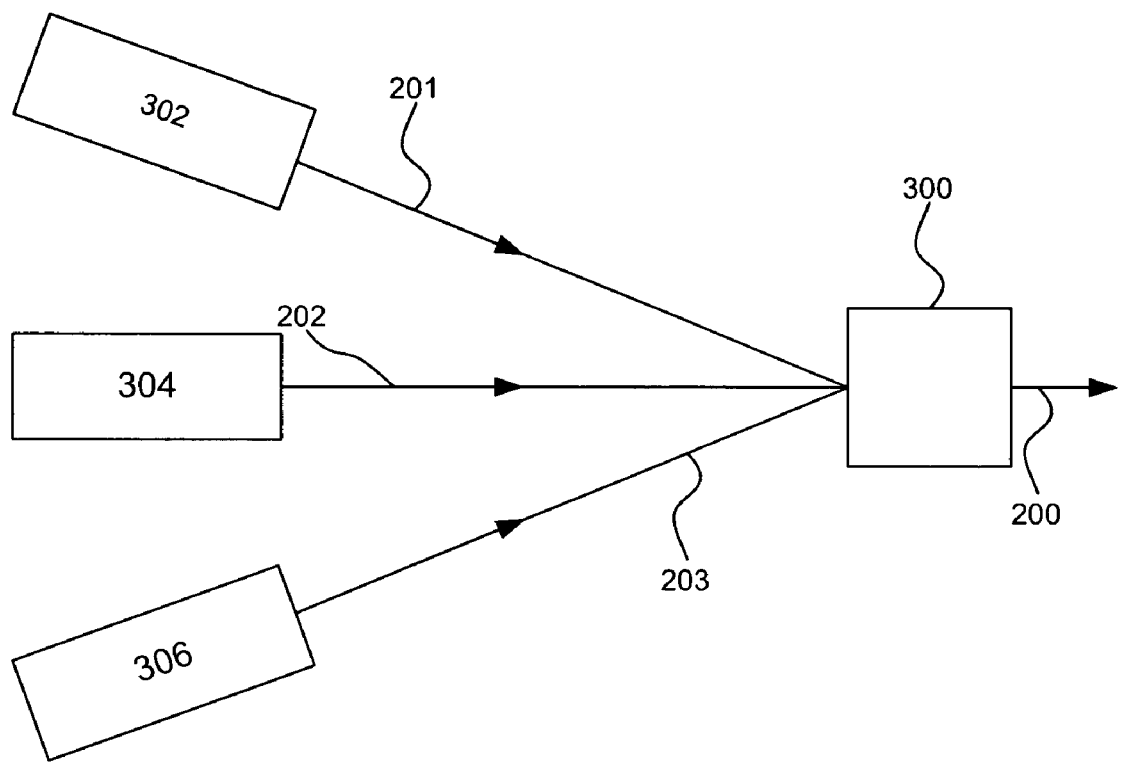
FIG. 3 is a block diagram of a beam delivery system suitable for providing the multi-source projection beam illustrated in FIG. 2.

FIG. 3 is a block diagram of a beam delivery system 300 suitable for providing the multi-source projection beam illustrated in FIG. 2.

Three radiation sources 302, 304, and 306 each provide a separate radiation beam 201, 202, 303. An input of the beam delivery system 300 receives the radiation beams 201, 202, 203.

In an embodiment, the beam delivery system 300 includes an optical switch. Typically, an optical switch controllably switches radiation from one or more input beam paths to one or more output beam paths. In this embodiment, the optical switch within the beam delivery system 300 is used to switch the source radiation beams 201, 202, and 203, to a common beam path, to form the projection beam of radiation 200. The time period B between successive pulses in each group of pulses is selected to be of sufficient duration to allow the optical switch to undergo a change in configuration. For instance, if the optical switch takes the form of one or more controllable mirrors, then the time period B is sufficient to allow the switch configuration to alter (e.g., the angle of one or more mirrors to be adjusted), such that the source radiation beams 201, 202, and 203 are in turn switched along the output beam path of the projection beam of radiation 200.

In the examples above, three source radiation beams are combined from to form the projection beam of radiation. The invention is not, however, limited to three source radiation beams. Based on the description herein, one skilled in the relevant art(s) will understand that any number of source radiation beams may be combined to provide the projection beam of radiation. Similarly, although an example of the optical switch being a mirror has been given, it will be appreciated that any addressable deflecting optical element that can operate as an optical switch can be used to combine the source radiation beams. As another example, a photo acoustic modulator can be utilized. Typically, the deflection is adapted in the time between successive pulses of the source radiation beams.

The timing of the radiation pulses in the projection radiation beam can be controlled via control of the timing of the generation of the radiation pulses and/or the optical path length between the radiation sources and the single common beam path. For instance, in one embodiment, the second radiation source 304 is arranged to generate a pulse a time period B after the first radiation source 302, with the third radiation source 306 then being arranged to generate a pulse a time period B after the second radiation source. In such an instance, the optical path between the radiation sources and the common beam path is the same length, such that the pulses in each group are separated by a time period B from the adjacent pulse. In an alternative embodiment, each of the radiation sources is arranged to generate an optical pulse at the same time, with the optical path length between the second radiation source and the common beam path being greater by a distance such that the pulses 202 arrive a time period B after the pulses 201 from the first radiation source 302.

In the above embodiment, it has been assumed that an addressable radiation beam-deflecting element is used to deflect the radiation from the source radiation beams along the common beam path. However, other techniques can be utilized to deflect the source radiation beams on to the common beam path.

Figure 4:
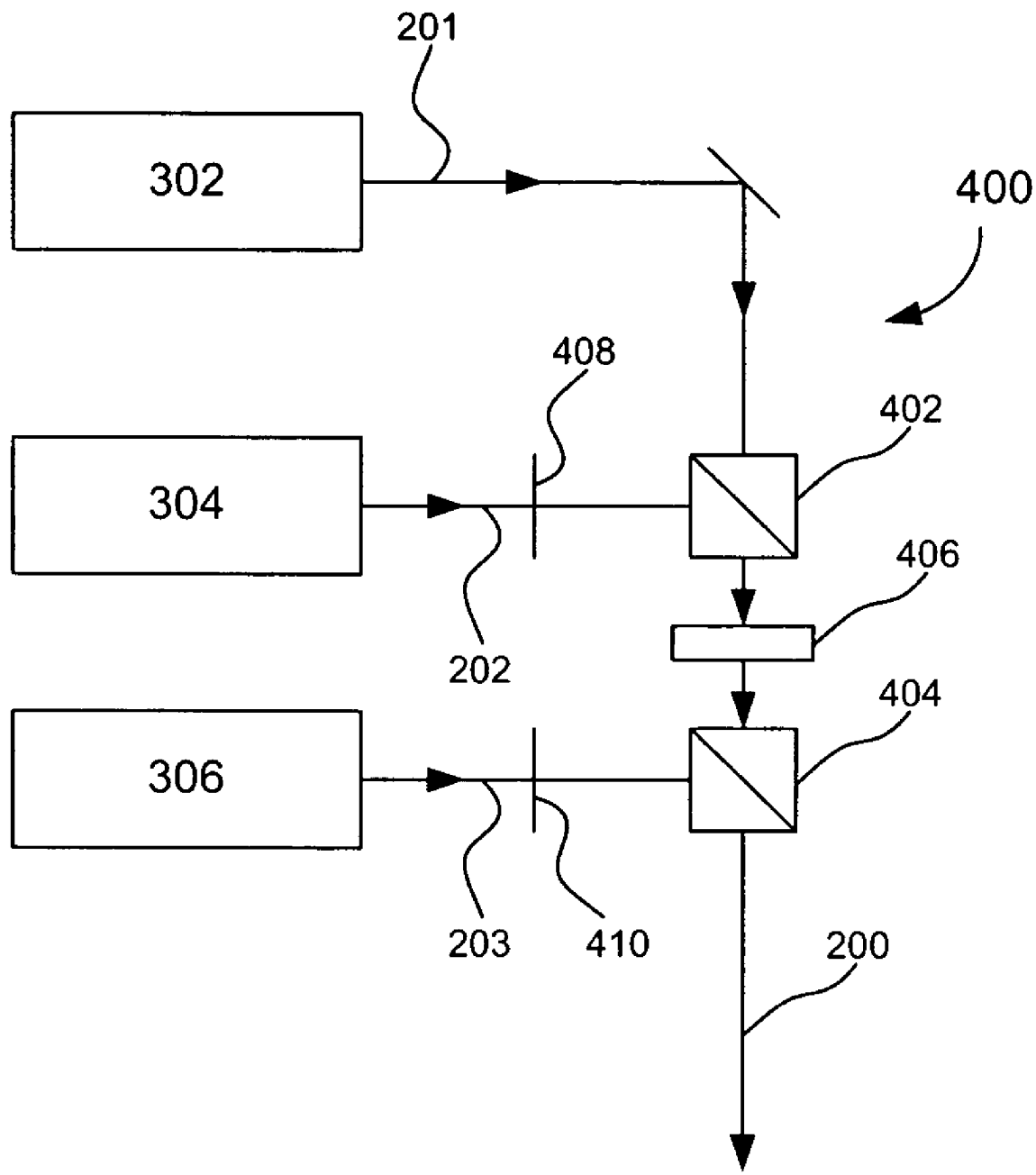
FIG. 4 is a block diagram of another multi-source beam delivery system suitable for providing the multi-source projection beam illustrated in FIG. 2.

For example, FIG. 4 is a block diagram of another multi-source beam delivery system 400 suitable for providing the multi-source projection beam illustrated in FIG. 2.

In this embodiment, the beam delivery system includes two polarizing beam splitters (PBSs) 402 and 404. To enable the source radiation beams to be deflected in the correct manner by the PBSs 402 and 404, each of the source radiation beams (or at least the source radiation beam incident upon the polarizing beam splitter) is polarized. In this particular embodiment, each of the source radiation beams 201, 202, and 203 is linearly polarized with the respective radiation sources 302, 304, and 306 being lasers. A Pockels cell 406 can be utilized to control the polarization of any incident radiation beam. The Pockels cell 406 is located along the optical path between the beam splitters 402 and 404.

Additionally, wavelength plates (e.g., half wavelength plates) can be utilized to switch any radiation beam from a first polarization state, to a second polarization state.

By way of example only, the operation of the beam delivery system 400 illustrated in FIG. 4 will now be described.

The first source radiation beam 201 is directed to the incident upon an input surface of the first PBS 402. The first source radiation beam 201 is assumed to be in a first linear polarization state (e.g., vertically polarized) and is transmitted by the PBS 402, in the direction of the common beam path of the projection beam of radiation 200, via the second PBS 404. The polarization state of the second source radiation beam 202, as incident upon the beam splitter 402, is a different polarization state from that of the first source radiation beam 201. In the example shown in FIG. 4, it is assumed that radiation source 304 outputs beam 202 in the same polarization state as the output of source 302 (e.g., vertically polarized), but with a half wavelength plate 408 changing the polarization state of the beam 202 to a different polarization state (e.g., horizontally polarized). Radiation beam 202 is subsequently reflected via the polarizing beam splitter in the direction of the common beam path of the projection beam of radiation. Thus, pulses of radiation from both the first radiation beam 201 and the second radiation beam 202 will be incident upon the Pockel cell 406, but in different polarization states.

The Pockel cell is switched so as to change the polarization of at least one of the two beams 201 and 202, such that the beams will be in the correct polarization state for transmission through the second PBS 404. Thus, all system beams 201 and 202 will be provided to the projection beam of radiation 200 via transmission through PBS 404.

Similarly, the third source radiation beam 203 is incident upon the second PBS 404 in a polarization state (e.g., horizontally polarized) such that the second PBS 404 directs the third source radiation beam 203 in the direction of the common beam path of the projection beam of radiation 200. Again, it is assumed that the output polarization state of the radiation source 306 is the same as that of radiation source 302, with a polarization state changing element (halfway plate 410) changing the polarization state of the beam 203 to the desired polarization state.

It will be appreciated that additional source radiation means may be added into the projection beam of radiation by the simple addition of an additional polarizing beam splitter for each radiation source, with a Pockel cell between each of the beam splitters.

Figure 6:
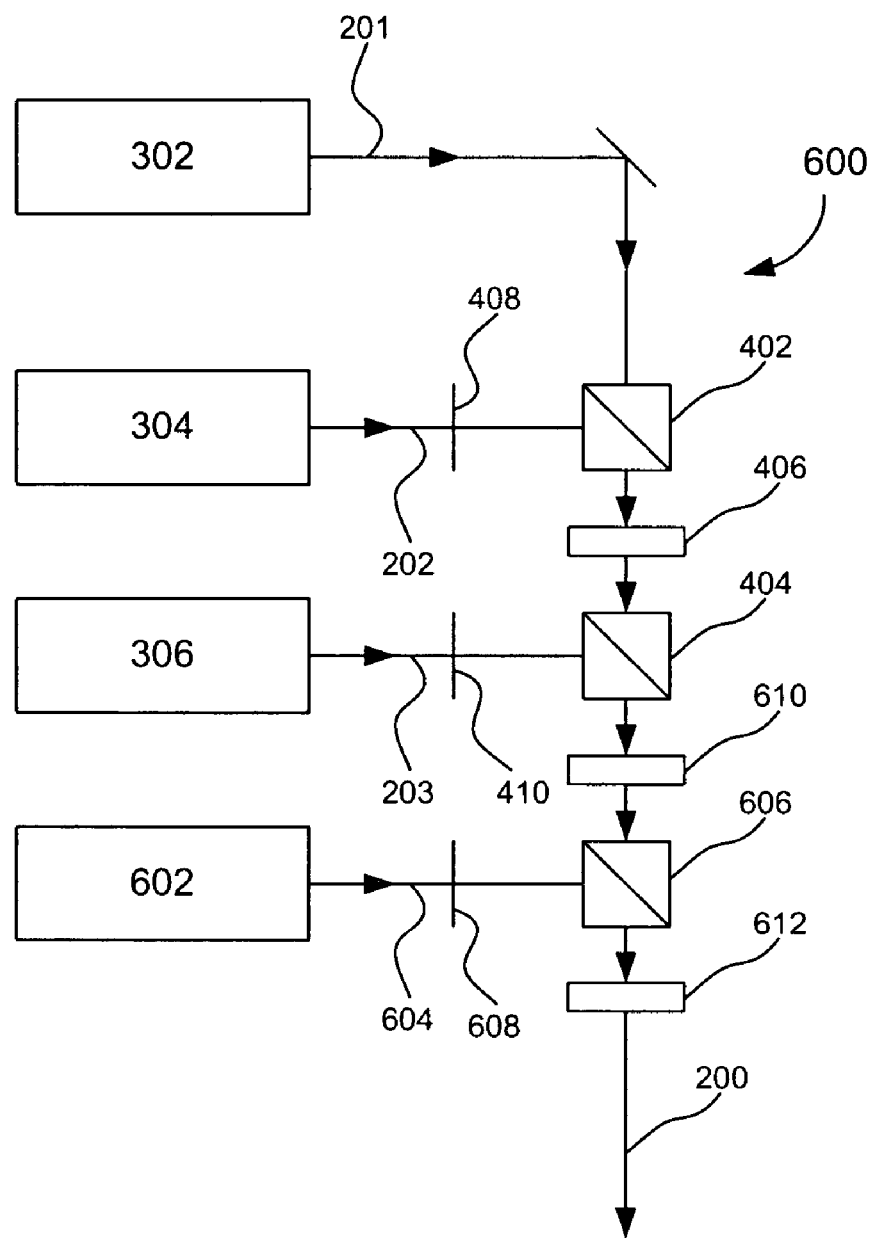
FIG. 6 is block diagram of another multi-source beam delivery system.

FIG. 6 is block diagram of another multi-source beam delivery system 600 including four radiation sources 302, 304, 306, and 602. An additional polarizing beam splitter (PBS) 606 is utilized to transmit all of the pulses from the previous radiation beams 201, 202, and 203 and to reflect the incident pulses from radiation beam 604 into the common beam path of the projection beam of radiation 200. A wave plate 608 is located to ensure that the radiation beam 604 incident upon the PBS 606 is in the desired polarization state. A Pockel cell 610 is switched so as to ensure that the radiation beams received from lasers 302, 304, and 306 are each in the correct polarization state such that the beams are transmitted through the PBS 606.

In the above embodiments, it has been assumed that each of the source radiation beams are generated in the same polarization state. However, it will be appreciated that if the source radiation beams are generated in the correct polarization states, then the wavelength plates are not required.

For some applications, it is desirable that the projection beam of radiation is of relative uniform intensity such that, for example, each group of pulses within the projection beam of radiation is of equal intensity. The power outputs of radiation sources typically vary over time, and hence by using a plurality of radiation sources, then statistically the variation in time of the energy of the groups of pulses is relatively uniform. For example, if each radiation source has a pulse accuracy of around 5%, then by using ten such radiation sources the total group intensity (with each group comprising one pulse from each radiation source) will be around 1.6%.

In some applications, due to cost, it is desirable to have fewer relatively high intensity radiation sources rather than a large number of lower powered radiation sources. The use of fewer radiation sources means that the statistical averaging is reduced. This can be overcome by providing a group intensity controller within the beam delivery system, arranged to control the intensity of at least one of the pulses within each group. This permits control of the radiation intensity of each group within predetermined limits.

In an embodiment, the intensity of one or more of the last pulses in each group of pulses is controlled. The measure is made of the intensity of the earlier pulses in each group of pulses. This measurement can be performed at any point along any of the optical beam paths. For instance, a measurement of the power of the radiation output from each of the relevant radiation sources can be made. Alternatively, or additionally, a measure of the power of the pulses within the projection beam of radiation can be made. Based upon the measured power, the intensity of the last pulse in each group (or last few pulses in each group) is controlled, so as to provide an overall group intensity of radiation within predetermined limits.

The intensity of the last pulse(s) can be controlled by varying the pulse intensity as provided to the projection beam of radiation over a predetermined range and/or selectively inhibiting the provision of the last pulse(s).

For example, a plurality of main radiation sources may be used to provide approximately (100-X)% of the desired group intensity, where X is less than 10, and more preferably X equals 2. If the measured power of these main radiation sources is between 0.5X and 1.5X away from the desired total group intensity, then an additional radiation source is used to add a pulse to the group. This additional source has a total output power of approximately 1.5X % of the desired group intensity, i.e. the maximum expected deviation of the power from the desired group intensity. For instance, the main source radiation sources may be used to provide approximately 98% of the desired group intensity. The actual intensity provided by these sources will vary, depending upon fluctuations in the sources. When the actual power/intensity provided by these lasers is between 97% and 99% of the desired group intensity/power (i.e., between 3% and 1% less than the actual desired group intensity), then a small radiation source (with a nominal power output of 3% of the total radiation power) is added to the single common beam path. The laser may be added to the single common beam path by inhibiting the generation of the pulses from the laser at the laser source, or at any point in the optical beam path of the relevant source radiation beam, including the single common beam path of the projection beam of radiation.

In the embodiment illustrated in FIG. 6, the intensity of the pulse 604 is varied by a variable attenuator 612. In an embodiment, he variable attenuator 612 is positioned at the output (i.e. on the single common beam path) of the beam delivery system 600. A Pockel cell within variable attenuator 612 has variable transmission and is switched such that the energy within the pulse 604 is modulated with the transmission of the Pockel cell.

Figure 5:
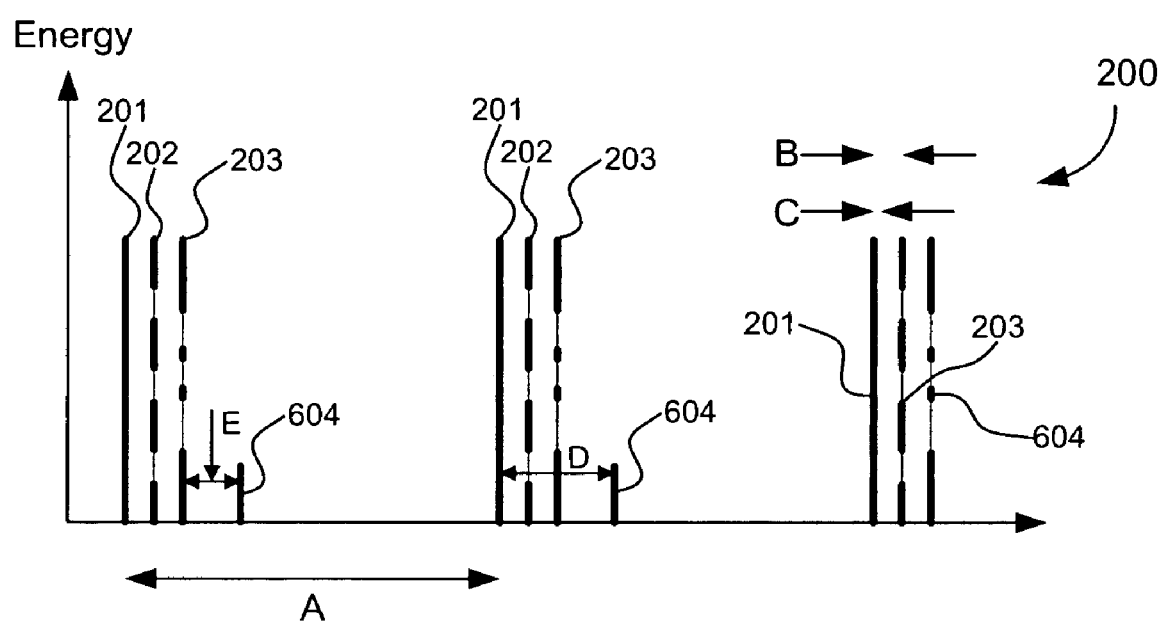
FIG. 5 is another timing diagram of a multi-source projection beam.

FIG. 5 is a timing diagram of the multi-source projection beam 200, including the radiation beam 604. FIG. 5 illustrates the energy of the projection beam of radiation 200 output from the apparatus shown in FIG. 6, as a function of time. In the example of FIG. 5, the intensity of pulses associated with the radiation beam 604 varies from the intensity of the pulses of radiation beams 201, 202, and 203.

For simplicity, in an embodiment, the energy of the radiation pulse 604 is not measured. Instead, the energy contribution of the pulse 604 is less than the typical energy contribution of the other pulses, so as to minimize the effect of the variation in the intensity of the last pulse on the total variation of the group intensity. For instance, if lasers are used as radiation sources having a 10% variation in output power from the nominal output power, then this will provide a total group power having a maximum normal variation of 1% (due to the averaging effect of having several laser sources). In this case, the last radiation source optionally contributes less than 10% of the total desired energy. The radiation source used to provide the pulse 604 should thus be less powerful than the other radiation sources, but be powerful enough to compensate for deviations in the power output of these other sources. In operation, the transmission of the attenuator 612 is varied to ensure that the contribution of the last pulse is of sufficient value to ensure that the total group intensity is within the desired predetermined range.

In FIG. 5, it can be seen that the pulse 604 within each group is of lower energy than the other pulses from the group. The common period of each group of pulses is D. In an embodiment, D equals approximately 1.4 µs. The invention is not, however, limited to this example. It can be seen that in the example of FIG. 5, the pulse 604 occurs a time period E after the second to pulse 203 in each group. The time period E here is greater than the typical time period B between successive pulses in the group. This is to permit the measurement of the energy/intensity of the earlier pulses 201, 202, and 203 to occur, as well as to allow the group intensity control to be set to the desired level such that the last pulse 604 is correctly attenuated to provide the desired total radiation intensity for each group.

A variable attenuator can be positioned at other points within the beam delivery system. For example, the variable attenuator 612 can be located in the radiation path of pulse 604 between the half wavelength plate 608 and the PBS 606. The transmission of the variable attenuator 612 can be altered and/or switched such that the final pulse 604 within each group is either added to the group, or not added to the group, depending upon the total energy of the other pulses within the group. Alternatively, system 600 can be controlled so as to switch polarization states during the last pulse 604, at a predetermined time after the start of the pulse 604. This can be utilized to provide a predetermined proportion of the last pulse to the projection beam of radiation. This predetermined proportion would typically be determined based upon the measurement of the power of the other pulses within the group.

For example, if the duration of the last pulse 604 is 120 ns, and 70% of the energy of the last pulse 604 is desirable to be added to the projection beam of radiation, then the variable attenuator 612 (e.g., Pockel cell) would switch a predetermined time after the start of the last pulse 604, such that only a predetermined proportion (70%) of the pulse 604 is added to the projection beam of radiation 200. If the energy is uniformly distributed over time within the pulse 604, then the Pockel cell would switch approximately 84 ns after the start of the last pulse 604, although it is appreciated that, in most instances, the energy will not be uniformly distributed within each radiation pulse.

In the above embodiment, the additional Pockel cell 612 is used as a variable attenuator. Further, the radiation sources are arranged to sequentially provide pulses to the group of pulses, as shown in FIG. 5, within the group, the order of pulses is pulse 201 from radiation source 302, pulse 202 from radiation source 304, pulse 203 from radiation source 306 and pulse 604 from radiation source 602. However, in an alternative embodiment, the apparatus 600 is arranged to deliver pulses to the group in the order 201, 202, 604 and 203. In other words, pulse 203 from radiation source 306 is the last pulse within the group of pulses. In such an instance, Pockel cell 612 can be omitted from the beam delivery system 600. Instead, the Pockel cell 610 is utilized as the variable attenuator, to attenuate the pulse 203 from the radiation source 306, so as to result in the desired total group intensity. In alternative implementations, it will be understood that Pockel cell 406 could be utilized as the variable attenuator, if pulse 201 or pulse 202 is respectively the last pulse within each group of pulses.

Figure 7:
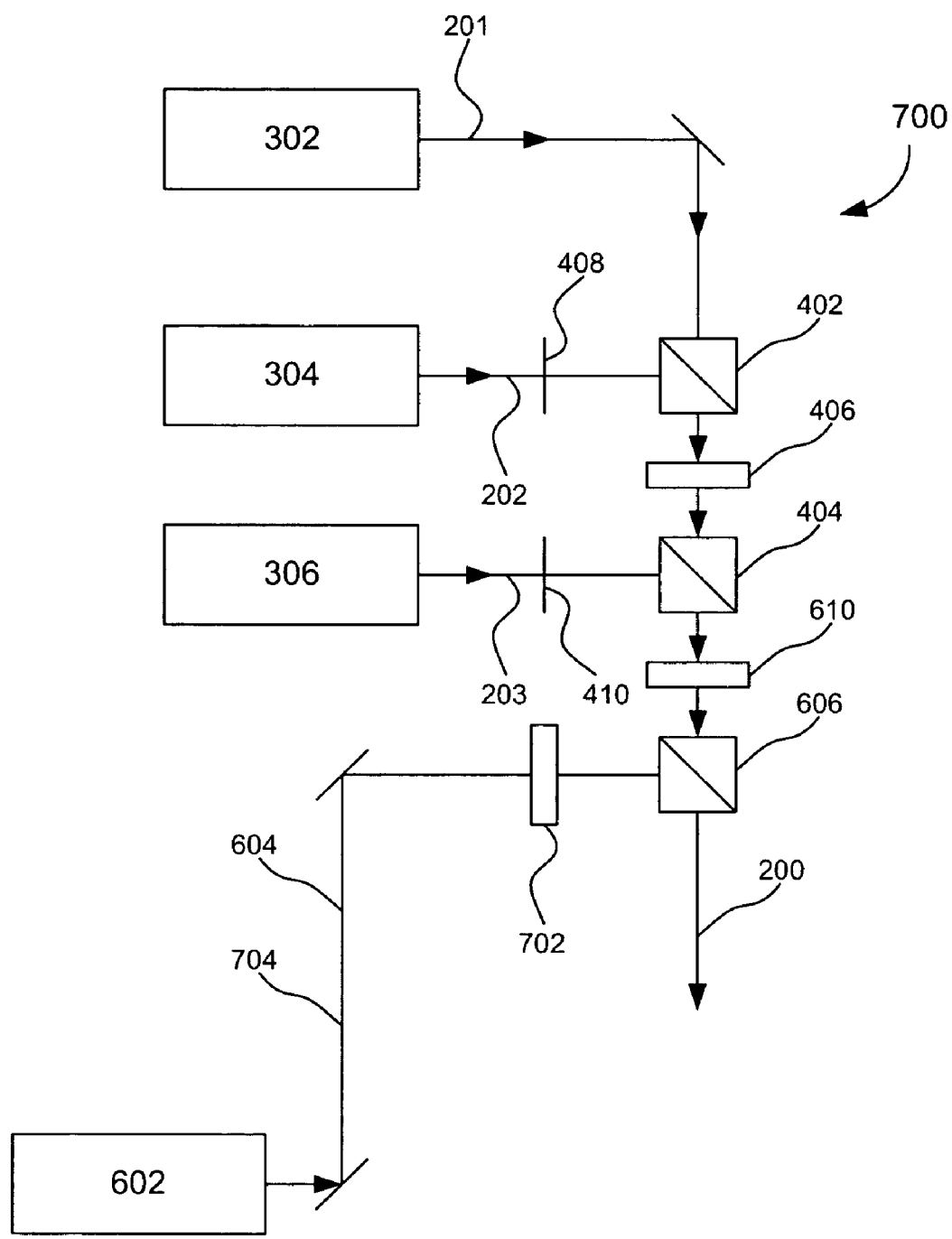
FIG. 7 is a block diagram of another multi-source beam delivery system suitable for providing the projection beam illustrated in FIG. 5.

FIG. 7 is a block diagram of another multi-source beam delivery system suitable for providing the projection beam illustrated in FIG. 5.

The beam delivery system 700 provides a measure of the energy of each pulse 201, 202, 203 and 604. The intensity of the final pulse 604 within the group is controlled by a variable attenuator 702, which can be, for example, a Pockel cell. In this embodiment, the variable attenuator 702 (e.g., Pockel cell) is located within the radiation path from the radiation source 602 to the PBS 606 The variable attenuator 702 (e.g., Pockel cell) is located adjacent the PBS 606. A measurement of the energy contained in pulse 604 is made, proximate to the radiation source 602. The transmission of the variable attenuator 702 (e.g., Pockel cell) is then adjusted so as to alter the intensity of the pulse 604, so as to provide the desired total group energy.

It will be appreciated that there will typically be a time needed for the transmission of the variable attenuator to be altered, once the measurement has been made of the energy/intensity of the final radiation pulse 604 in each group. In this embodiment, this time is provided by ensuring that the radiation pulse 604 takes a relatively long path from the radiation source 602 to the common beam path 200, e.g., to PBS 606. For example, the path 704 can be an optical delay line of, for example, 13 m. It would take a pulse of light approximately 40 ns to travel this distance, and this would allow sufficient time to set the transmission of the variable attenuator 701 (e.g., Pockel cell) to the desired level, assuming that the energy of the pulse 604 was measured at/adjacent to the radiation source 602.

It will be appreciated that in the embodiment shown in FIG. 7, it is not necessary for the pulse 604 generated by the radiation source 602 to be of lower energy than any of pulses 201, 202, 203, as any variation within the energy of each pulse 201, 202, 203 & 604 within the group can be compensated for by varying the transmission of the variable attenuator provided by variable attenuator 702 (e.g., Pockel cell).

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections may set forth one or more, but not all, exemplary embodiments of the present invention as contemplated by the inventor(s), and thus, are not intended to limit the present invention and the appended claims in any way.

What is claimed is:

1. A lithographic apparatus, comprising:
    an illumination system that supplies a beam of radiation;
    an array of individually controllable elements configured to pattern the beam of radiation;
    a substrate table that holds a substrate; and
    a projection system that projects the patterned beam onto a target portion of the substrate;
    wherein the illumination system includes a beam delivery system having at least one radiation beam deflecting element and at least one radiation input that receives a plurality of source radiation beams from respective radiation sources, said at least one radiation beam deflecting element being arranged to deflect each of the received source radiation beams along a single common beam path and to direct each of the received source radiation beams onto the array of individually controllable elements to form the patterned beam.

2. The apparatus according to claim 1, wherein each of said source radiation beams is a pulsed radiation beam including a periodic series of radiation pulses, wherein the beam of radiation includes a series of discrete radiation pulses, and wherein each radiation pulse in the beam of radiation is formed of a respective single pulse from a respective single source radiation beam.

3. The apparatus according to claim 2, wherein each of the source radiation beams is of substantially the same wavelength of radiation, and each of the periodic series of radiation pulses has substantially the same repetition frequency.

4. The apparatus according to claim 1, wherein the beam of radiation includes a periodic series of groups of radiation pulses, and wherein each group of pulses is separated by a time period sufficient to allow a change in configuration of at least one of said controllable elements.

5. The apparatus according to claim 4, wherein the beam delivery system further comprises a group intensity controller arranged to control the intensity of at least one pulse within each group, to ensure the radiation intensity of each group is within predetermined limits.

6. The apparatus according to claim 5, wherein the group intensity controller is arranged to selectively inhibit the provision of said at least one pulse to said group of pulses.

7. The apparatus according to claim 5, wherein the group intensity controller is arranged to controllably attenuate the intensity of said at least one pulse.

8. The apparatus according to claim 5, wherein the at least one pulse comprises the last pulse in each group, and the group intensity controller is arranged to control said intensity in dependence upon the measured intensity of the other pulses within said group.

9. The apparatus according to claim 5, wherein the at least one pulse comprises the last pulse in each group, and the group intensity controller is arranged to control said intensity in dependence upon the measured intensity of each of the pulses within said group.

10. The apparatus according to claim 1, wherein said at least one radiation beam deflecting element comprises a controllable radiation beam deflecting element, each of the received source radiation beams being incident upon said controllable radiation beam deflecting element, which acts to deflect each received source radiation beam along the single common beam path.

11. The apparatus according to claim 1, wherein each of said source radiation beams is polarized, and said at least one radiation beam deflecting element comprises at least one polarized beam splitter.

12. The apparatus according to claim 11, wherein said beam delivery system further comprises a controllable polarization changing element arranged to change the polarization state of incident radiation.

13. The apparatus according to claim 1, further comprising said respective radiation sources that provides the plurality of source radiation beams.

14. A method of projecting a pattern onto a substrate, comprising:
   receiving a plurality of source radiation beams from a plurality of corresponding radiation sources;
   deflecting each of the plurality of source radiation beams along a common beam path to generate a beam of radiation;
   imparting the beam of radiation with a cross-section pattern; and
   projecting the patterned beam of radiation onto a target portion of a substrate.

15. The method according to claim 14, wherein each of said source radiation beams is a pulsed radiation beam including a periodic series of radiation pulses, and wherein the beam of radiation includes a series of discrete radiation pulses, each radiation pulse in the beam of radiation being formed of a respective pulse from a respective source radiation beam.

16. The method according to claim 15, wherein each of the source radiation beams is of substantially the same wavelength of radiation, and wherein each of the periodic series of radiation pulses has substantially the same repetition frequency.

17. The method as claimed in claim 14, wherein the beam of radiation comprises a periodic series of groups of radiation pulses, and wherein each group of pulses is separated by a time period sufficient to allow a change in configuration of at least one of said controllable elements.

18. The method as claimed in claim 17, wherein each group of pulses comprises one pulse from each source radiation beam.

19. The method as claimed in claim 17, wherein the intensity of at least one pulse within each group is controlled, so as to ensure the total radiation intensity of each group is within predetermined limits.

* * * * *